United States Patent [19]

Beasom

[11] Patent Number: 5,322,804
[45] Date of Patent: Jun. 21, 1994

[54] INTEGRATION OF HIGH VOLTAGE LATERAL MOS DEVICES IN LOW VOLTAGE CMOS ARCHITECTURE USING CMOS-COMPATIBLE PROCESS STEPS

[75] Inventor: James D. Beasom, Melbourne Village, Fla.

[73] Assignee: Harris Corporation, Melbourne, Fla.

[21] Appl. No.: 882,070

[22] Filed: May 12, 1992

[51] Int. Cl.$^5$ ............................................. H01L 21/70
[52] U.S. Cl. ........................................ 437/29; 437/40; 437/44; 437/51; 437/54; 437/56
[58] Field of Search ................ 437/29, 40, 41, 51, 437/44, 54, 56; 257/500, 501, 502

[56] References Cited

U.S. PATENT DOCUMENTS

| | | | |
|---|---|---|---|
| 4,285,116 | 8/1981 | Meguro | 437/44 |
| 4,403,395 | 9/1983 | Cunnan | 437/41 |
| 4,795,716 | 1/1989 | Yilmaz et al. | 437/29 |
| 4,823,173 | 4/1989 | Beasom | 257/262 |
| 4,914,051 | 4/1990 | Huie et al. | 437/29 |
| 5,024,962 | 6/1991 | Murray et al. | 437/90 |

FOREIGN PATENT DOCUMENTS 196568  8/1986  Japan ...................... 257/500

Primary Examiner—Tom Thomas
Attorney, Agent, or Firm—Charles E. Wands

[57] ABSTRACT

Region forming steps or interconnect-forming steps through which low voltage CMOS devices are formed in a semiconductor wafer are also employed to simultaneously form one or more regions or layers at selected sites of a substrate where high voltage devices are to be formed. Such selective modification of an already existing mask set designed for low voltage CMOS topography allows additional doping of the substrate or provision of further overlay material to accommodate the effects of high voltage operation of selected areas of the water and thereby effectively performs precursor tailoring or modification of those portions of the wafer where a high voltage condition will be encountered.

13 Claims, 9 Drawing Sheets

INTEGRATION OF HIGH VOLTAGE LATERAL MOS DEVICES IN LOW VOLTAGE CMOS ARCHITECTURE USING CMOS-COMPATIBLE PROCESS STEPS

FIELD OF THE INVENTION

The present invention relates in general to the manufacture of integrated circuits and is particularly directed to scheme for integrating high voltage lateral MOS devices in a low voltage CMOS architecture by selective application of the processing steps that are employed to form the low voltage CMOS devices.

BACKGROUND OF THE INVENTION

There are a number of signal processing applications which require that low voltage CMOS devices (for logic and sometimes analog functions) and high voltage MOS devices (typically used for switching or level shift circuits) be integrated in the same semiconductor architecture. Because of the diversity of both the types and parametric variations of the device structures, the processes used to form such combined technology architectures are often complex, sometimes requiring upwards of fifteen masking steps to pattern and layout the topography of the wafer. Moreover, as there is both an increase in cost and a decrease in yield as the number of mask steps increases, it is desirable to reduce the number of steps necessary to incorporate all of the various types of devices that make up such a multifunctional signal processing architecture.

One type of semiconductor structure that can be used to realize a high voltage MOS device in a low voltage CMOS architecture involves the addition of a lateral drift, drain-extension region to increase the reverse breakdown of the MOS structure, as described in my U.S. Pat. No. 4,823,173 entitled "High Voltage Lateral MOS Structure with Depleted Top Gate Region," issued Apr. 18, 1989, assigned to the assignee of the present application and the disclosure of which is herein incorporated. Such a lateral high voltage MOS device is diagrammatically illustrated in FIG. 1 as comprising a lateral drift, drain-extension region 11, which is contiguous with a drain region 13 and extends along the surface 14 of the body 10 of the MOS device toward a source region 12. The lateral drift region is formed beneath a thick oxide layer 15 (which may be formed by local oxidation) or under a thin (typically gate) oxide layer 17. The parameters of the drift region (e.g. doping profile in ions per square centimeter) are predefined such that, in the presence of a reverse bias applied between the drain region 13 and the body 10 (in which the channel is formed from the drift region 13 to the source region 12 beneath a gate electrode 18), the drift region becomes totally depleted of charge carriers prior to the occurrence of breakdown field in the depletion layer that extends from a reverse-biased drain-to-body PN junction 21, particularly at the sharp curvature portion 23 of the junction beneath gate electrode 18, where the total electrical field strength is increased by the presence of the bias applied to the gate. Typically, the doping per unit area of the drift region 11 is limited to a value on the order of 1 to $2 \times 10^{12}$ ions/cm$^2$ in order to satisfy this fully depleted requirement.

Thus, by adding such a lateral drift region to what is otherwise a low voltage MOS structure, the device is effectively transformed form a low voltage MOS device into a high (reverse breakdown) voltage device. Unfortunately, conventional water processing to provide such a lateral drift region involves both a special mask and a special doping step (e.g. ion implantation) used exclusively for the formation of the drift region, which increases the cost and complexity of the manufacturing process.

SUMMARY OF THE INVENTION

In accordance with the present invention, the need for additional processing steps that are dedicated exclusively to the formation of high voltage device regions, such as the drift region described above, is effectively obviated by taking advantage of capabilities of existing processing steps used to form low voltage CMOS devices. In particular, the present invention involves selectively employing region forming steps or interconnect-forming steps through which low voltage CMOS devices are realized, so as to simultaneously form one or more regions or layers at selected sites of a substrate where high voltage devices are to be formed. Such selective modification of an already existing mask set designed for low voltage CMOS topography allows additional doping of the substrate or provision of further overlay material to accommodate the effects of high voltage operation of selected areas of the water and thereby effectively performs precursor tailoring or modification of those portions of the wafer where a high voltage condition will be encountered.

Pursuant to a first embodiment of the present invention, the above-described drift region of a high voltage MOS device may be formed by making use of a field implant step through which a channel stop region of a complementary low voltage MOS device is formed. Taking the case of a high voltage P-channel MOS device as an example, its drift region, which is to extend from its P drain region toward its P source region, but is separated from the source region by surface material of the body channel over which an insulated gate is disposed, is formed by making use of a P impurity implant step that is used to increase the field threshold or form an increased impurity concentration, channel stop region in a surface portion of a P-well portion of the wafer in which a complementary (N-channel) MOS device is formed. Typically, such a "field threshold augmentation" (or field implant) region is self aligned with the field oxide by first forming the field threshold augmentation region and then using local oxidation (LOCOS) to form a relatively thick oxide region everywhere the field implant has been provided.

Thus, where a high voltage PMOS device is to be formed using already available low voltage processing steps, a P-type field threshold augmentation region would be formed in one or more surface portions of P-type material (e.g. a P-well) of the wafer where a complementary, N-channel MOS device is to be formed, so as to prevent inversion of such one or more surface portions of the P-type material in which the N-channel MOSFET resides. Since the implant dose rate of such a field doping step is typically in a range not exceeding 1 to $2 \times 10^{12}$/cm$^2$, it is readily adaptable to the formation of a drift region of the desired high voltage complementary MOS device. The field oxide, which is thereafter formed by local oxidation of the surface of the field threshold augmentation implant, will be partially bridged by the gate electrode of the PMOS device which overlies a thin gate oxide atop the N well material between the P-type source and the lateral P- type drain-extension region, so that the gate electrode will effectively overlap each of the P-source region and the P drift region.

A caveat to this process is the necessity of spacing a corresponding N-type field threshold augmentation region employed in the PMOS portion of the wafer away from the P-type drain region, in order to avoid a reduction in the drain-to-body junction breakdown. (Similarly, in the complementary (NMOS) device, it is necessary to space the P-type field threshold augmentation region used to form the drift region of the PMOS device away from its N-type drain region). The manner in which such drain-to-field threshold augmentation implant spacing is achieved will depend upon whether more than one mask is used to define the field region implant.

Where each of the (N and P) field implants is formed using its own dedicated mask, it is a simple matter to provide the requisite spacing in the design of each mask. However, in more efficient processes where a blanket implant of one (N or P) conductivity type dopant is initially performed everywhere a field implant is desired, and then a second, compensating or overdose implant mask is employed to delineate respective N and P field thresholds (and associated N and P drift regions of complementary high voltage MOS devices), the drain-to-field implant spacing may be accomplished by using the local oxidation mask (e.g. silicon nitride-on-pad oxide), in order to preliminarily define the topography surrounding the drain regions of the devices.

Namely, in lieu of tailoring two separate field implant masks, the nitride mask, which is used earlier in the processing sequence, is designed so that it provides the necessary additional spacing of a surface barrier or offset around that portion of the (P or N) body into which the drain doping is to be formed. This spacing is maintained throughout the process, so that there is always some surface portion of a (P or N) well material between the (N or P) drain region and the (P or N) field implant. After local oxidation of the field implant regions, the nitride and pad oxide are stripped and a new thin oxide layer is formed over the surface.

Where the lateral drift region is formed as a dual implant region, for example in the case of a high voltage, lateral PMOS device, a relatively shallow N-type layer overlying a somewhat more deeply implanted P-type region, each portion of the lateral drift region may be formed simultaneously with the formation of respective P and N field implants of the complementary MOS architecture in which the PMOS device resides. As described in my above-referenced U.S. Patent, a dual layer drift region has the advantage of providing a reduction in on-resistance. In this embodiment, the doping profiles (including depth and impurity concentration) of the complementary MOS device is necessarily different than that of the MOS device of interest.

In some circumstances, the doping profile of the complementary device's field implant may, by itself, be different (in particular heavier) than desired for the profile of the drift region to be formed in the high voltage MOS device of interest. In this event, advantage may be taken of a like or same polarity type impurity introduction step, so as to provide a compensating like-polarity well region in the body of the device. For example, in the case of forming a high voltage P channel MOS device in an $N^-$ body, the mask used to introduce an N type well region into the complementary (N bulk) material of the wafer may be selectively modified to simultaneously introduce such an N well region in the surface portion of the $N^-$ body where the P drift region is to be formed by means of a P field implant carried out in the complementary (NMOS) device. The differential (increased) doping of the N well relative to the $N^-$ body effectively allows the P field implant that is employed to form the P drift region to be 'tuned' to within a target window of the desired depletion threshold of the drift region. Namely, the introduction of such a 'tuning' N well into the surface of the $N^-$ body compensates some of the P field doping, so as to reduce the net doping of the drift region and provide a lower total depletion voltage for the drift region resulting from both the lower net drift region charge and the increased doping concentration (N vs $N^-$) in the $N^-$ body adjacent to the drift region.

As a functionally equivalent alternative to the use of a field implant from a complementary device to form the drift region of a high voltage MOS device, it is also possible to use a gate threshold adjustment step for the same purpose. Namely, as explained above, the purpose of the field implant of a complementary device is to increase the surface concentration of the body so as to prevent the realization of an effective surface inversion layer that can potentially short two devices together. Such a field region is then subjected to local oxidation to form a thick overlying field oxide.

In some MOS processes, a reduced doping implant may be employed in the gate region in order to adjust the turn-on threshold voltage of the device. Examples are a buried channel device and a depletion mode transistor. Here the 'threshold' implant underlies a thin surface oxide (on which a gate electrode is formed) rather than a thick field oxide. As long as the threshold adjustment implant of the adjusted device is of sufficient doping concentration to form a PN junction with the body of the high voltage MOS devices of interest, it may be employed to form a drift region.

Because the field implant step takes place prior to formation of the gate electrode of an MOS device, the drift region is not necessarily aligned with the gate. Since the gate must overlap the drain-extension region, there is an alignment tolerance between the source region (which is self aligned with and defined by an edge of the (polysilicon) gate material) and the field implant drift region with which the gate must be aligned (overlap). In accordance with a further aspect of the present invention, this alignment tolerance problem may be solved by introducing a 'link' region between the field implant drift region and the drain edge of the polysilicon gate electrode. In the case of a high voltage PMOS device the link region may be formed by using the P+ implant step used for the source and drain region of a low voltage device. Since the link region is more heavily doped than the field implant, its reverse breakdown voltage is lower than that of the more lightly doped drain-extension region. Consequently, the parameters of the drift region must be tailored so that the drift region becomes totally depleted before breakdown occurs in the link region-to-body junction under a reverse bias condition.

In addition, because the more lightly doped drift implant region is sensitive to charge build-up on the surface of the overlying field oxide (its conductivity is subject to being 'modulated' by such charge), an electrostatic shield plate layer may be formed on a portion of the field oxide that overlies the interface of the drift region with the link region, and the shield plate layer may be connected to the link region. This shield plate layer helps prevent mobile charge, that might otherwise settle on the field oxide, from modifying the intended electrical parameters (altering the effective doping) of the drain-extension, drift region.

The methodology of the present invention of taking advantage of the capabilities of the processing steps that are used to form a low voltage complementary device is not only applicable to the formation of and tailoring the characteristics of a lateral drift, drain-extension region, but also to other aspects of the architecture through which a lateral high voltage MOS structure is defined.

For example, when the interconnect track (typically an aluminum layer) for the drain region is routed to another, spatially removed area of the wafer, protection must be provided against the formation of an induced, parasitic channel in a surface portion of the body beneath the aluminum track, since such a channel could cause an unwanted connection between the drain region and another region. Because of the substantially increased magnitude voltage (e.g. on the order of several hundred volts) that may be present on this aluminum layer in the case of a high voltage device, the resulting electric field imparted to the surface of the underlying body will far exceed the threshold voltage necessary to overcome the channel stop formed by the field implant of a complementary polarity type low voltage MOS device. Namely, an N field channel stop implant formed in the surface of an N− body in which a low voltage PMOS device is provided will usually have too low a threshold to serve as a channel stop for a high voltage PMOS drain.

In accordance with a further embodiment of the present invention, this high voltage interconnect problem may be solved by increasing the impurity concentration region of a portion of the field implant region, for example by using the body contact doping step to incorporate a high impurity concentration layer within the field implant region. In the case of a high voltage PMOS device, an N+ layer may be introduced within the confines of the N field implant region, so as to increase its channel stopping functionality to the degree necessary to interrupt a high voltage induced inversion layer along the interface of the body with the field oxide. Preferably, the N+ layer (formed during an N+ contact-implant step, for example) is located in the middle of a (ring-shaped) N field implant, so that its edge terminates in an intermediately doped portion, thereby reducing the crowding of electric field flux lines at the N+ to N− body high/low junction, which has the potential of inducing avalanche injection-limited breakdown.

Depending upon available process capability, other high voltage doping enhancements may be possible, For example, if the process provides for a more graded N+ implant, such as a deep N+ region, the field implant may be modified to incorporate such a graded profile in the vicinity of (but spaced apart from) the drain region. Another modification of the above technique is to run a separate length of the polysilicon material, of which MOS gate electrodes are formed, beneath the aluminum track, so as to effectively shield the underlying body surface from the electric field emanating from the aluminum track. Such a polysilicon layer may also be biased as necessary to provide the requisite shielding functionality, so that any inversion layer that is otherwise induced in the surface of the body beneath the drain contact aluminum layer is effectively interrupted where the polysilicon crosses underneath the aluminum track. The polysilicon shield layer may also be combined (conductively joined) with the body contact implant, so as to form shielding ring around the drain region, thereby providing complete protection against a high voltage induced parasitic channel that would otherwise short the high voltage drain to another region.

DETAILED DESCRIPTION

As described briefly above, in order to reduce the processing complexity of the conventional use of special mask and doping steps for integrating high voltage devices in the same integrated circuit architecture as low voltage devices, the present invention takes advantage of capabilities of existing processing steps used to form low voltage CMOS devices and selectively modifies an already existing mask set designed for low voltage CMOS topography, so as to perform precursor tailoring or modification of those portions of the wafer where high voltage conditions will be encountered.

Pursuant to a first embodiment of the present invention, a drain-extension, drift region used to realize a high voltage lateral MOS device is formed by making use of the same field implant step through which a channel stop region of a complementary low voltage MOS device is formed. Taking the case of a high voltage P-channel MOS device diagrammatically illustrated at 30 in FIGS. 2 and 3 as a non-limitative example, a P-type drift region 31 is to be formed in the surface of an N− semiconductor body or substrate 32, so that the drift region 31 extends from a P drain region 33 toward a P type source region 34.

Figure 1:
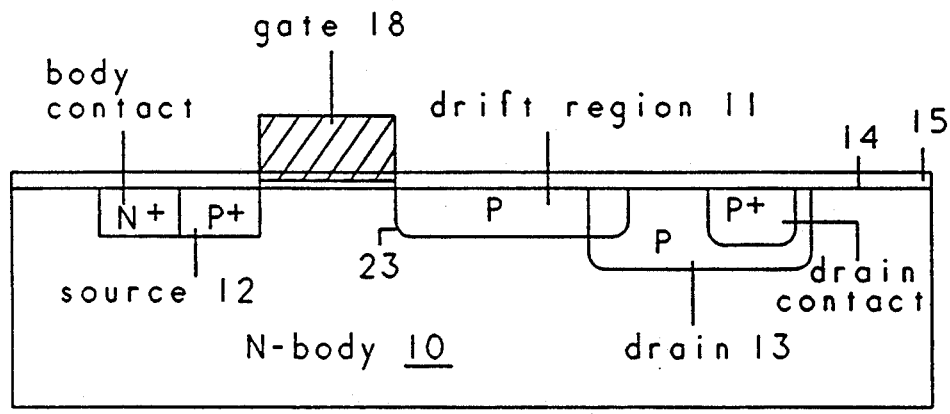
FIG. 1 diagrammatically illustrates the cross-section of a high voltage MOS device having a lateral drift, drain-extension region to increase the reverse breakdown of the MOS structure, as described in U.S. Pat. No. 4,823,173.
Figure 3:
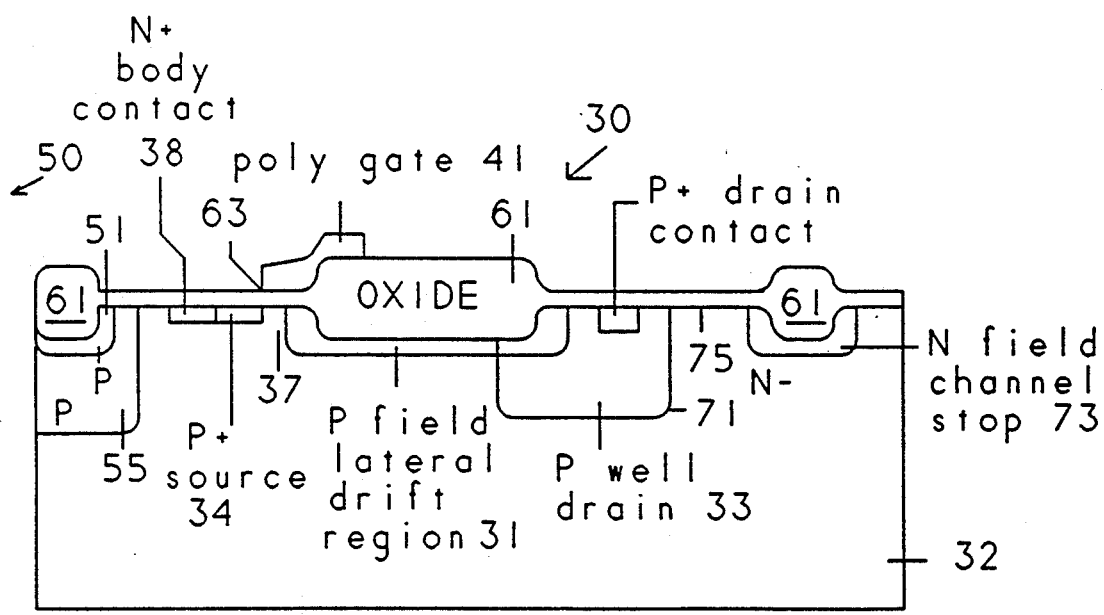
FIG. 3 diagrammatically illustrates the cross-section of the high voltage MOS device of FIG. 2.

P drain region 33 may be a deep graded region, such as a P-well region 33 shown in FIG. 3, to obtain maximum drain-to-body junction breakdown, or simply a shallow region formed, for example, from a P+ drain-to-source doping step. In the latter case it may be desirable to surround the drain with the drift region as described in the above referenced '173 patent, in order to maximize junction curvature reduction of the basic drain-to-body diode breakdown. The drift region 31 is separated from source region 34 by a surface channel portion 37 of the body 32 over which an insulated polysilicon gate 41 is disposed. An N+ body contact 38 is provided at the surface of the substrate.

Rather than use a separate mask and implant step for its formation, drift region 31 is formed by a P impurity implant step that is used to increase or augment the field threshold beneath an overlying field oxide, or form an increased impurity concentration, channel stop region 51 in a surface portion 53 of a P-well portion 55 of the wafer in which a complementary (N-channel) MOS device 50 is formed. As described previously, such a field implant region 51 is self aligned with a field oxide layer 61 by a surface implant step (e.g. implanting boron ions in the case of a P field implant) to form field threshold augmentation (channel stop) region 51, and then using local oxidation (LOCOS) to build up a relatively thick oxide layer 61 everywhere the field implant has been provided.

Thus, the mask employed to define the location of one or more P field implant regions in the surface of P well 55 of the NMOS 50 device is configured to accommodate the introduction of P ions into the surface portion of the N− body where drift region 31 is to be provided. As the implant dose rate of such a field doping step is typically in a range not exceeding 1 to $2 \times 10^{12}/cm^2$, it is readily suited to the simultaneous formation of P-type drift region 31 of high voltage PMOS device 30. Local oxidation of the exposed surface of the P implanted body (typically masked by a silicon nitride layer disposed atop a pad oxide layer) will build up a relatively thick layer of field oxide 61, which overlies and is self-aligned with the lateral drift region 31 of the PMOS device 30.

Figure 2:
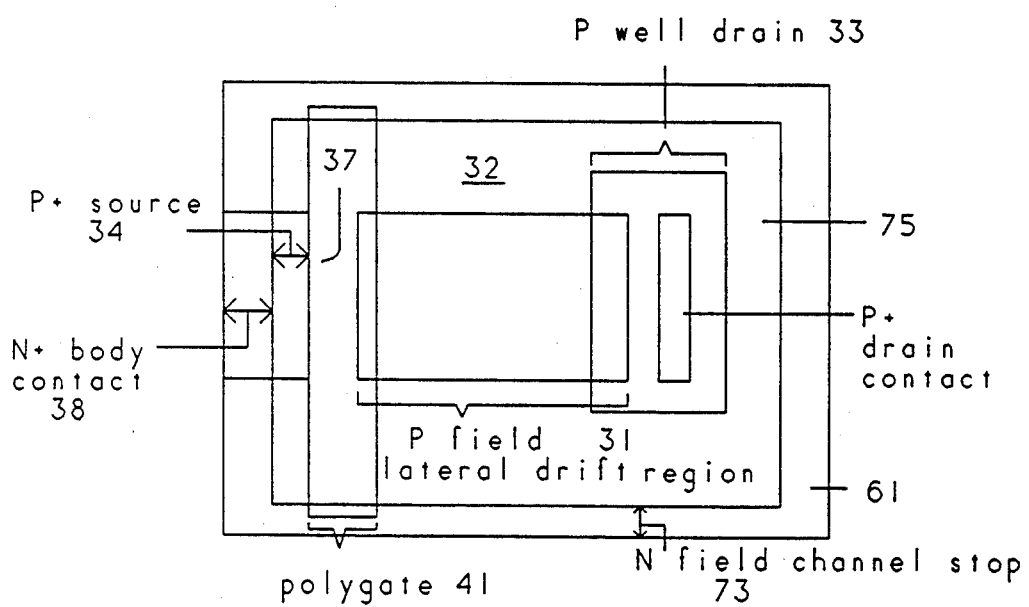
FIG. 2 diagrammatically illustrates a top view of a high voltage MOS device having a lateral drift, drain-extension region which is formed using a field implant step employed to form a channel stop region of a complementary MOS device.

Thereafter, after removal of the (nitride) local oxidation mask and formation of gate oxide layer 63 over surface portion 37 of the N− body 32, gate electrode 41 is formed atop gate oxide layer 63, so as to overlap each of source region 34 and drift region 31. Because lateral drift region 31 underlies and is self aligned with field oxide layer 61, gate electrode 41 is formed so as to partially overlie the field oxide layer, so that it will effectively overlap P drift region 31.

Where an N-type field implant region 73 is provided in association with PMOS device 30, it is necessary to space N-type field implant region 73 apart from P drain region 33 in order to avoid a reduction in the breakdown voltage of the PN junction 71 between drain region 33 and body 32. In FIGS. 2 and 3 this spacing is identified by a separation surface portion 75 of N− body 32, which separates N channel stop region 73 from P drain region 33. Likewise, in a complementary NMOS device, it is necessary to space apart from its N-type drain region, the P-type field threshold augmentation region 61 formed by the P field implant step that is also used to form the drift region of the PMOS device 30. The manner in which such spacing of the drain-to-field junction from the threshold augmentation implant is achieved will depend upon whether more than one mask is used to define the field region implant.

More particularly, where each of the (N and P) field implants is formed using its own dedicated mask, it is a simple matter to provide the requisite spacing in the design of each mask. However, in more efficient processes where a blanket implant of one (N or P) conductivity type dopant is initially performed everywhere a field implant is desired, and then a second, compensating or overdose implant mask is employed to delineate respective N and P field thresholds (and associated N and P drift regions of complementary high voltage MOS devices), the drain-to-field implant spacing may be accomplished by using the local oxidation mask (e.g. silicon nitride-on-pad oxide), in order to preliminarily define the topography surrounding the drain regions of the devices.

Figure 4:
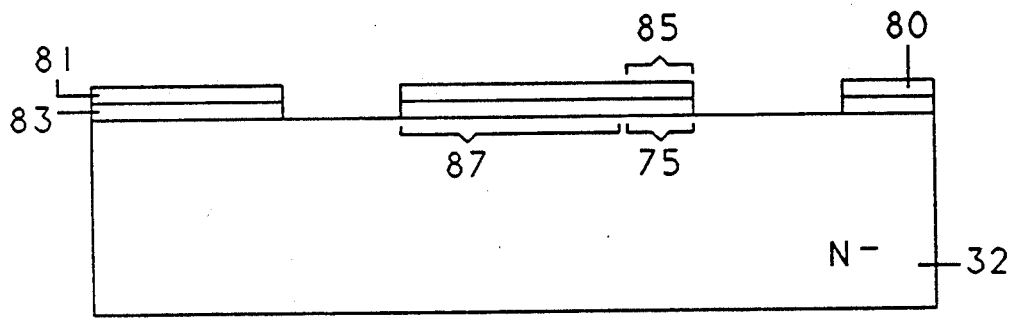
FIG. 4 shows a field implant, local oxidation mask configured to have a portion overlying surface portion that provides the necessary spacing around a portion of an N−body into which a P drain region is to be formed.
Figure 5:
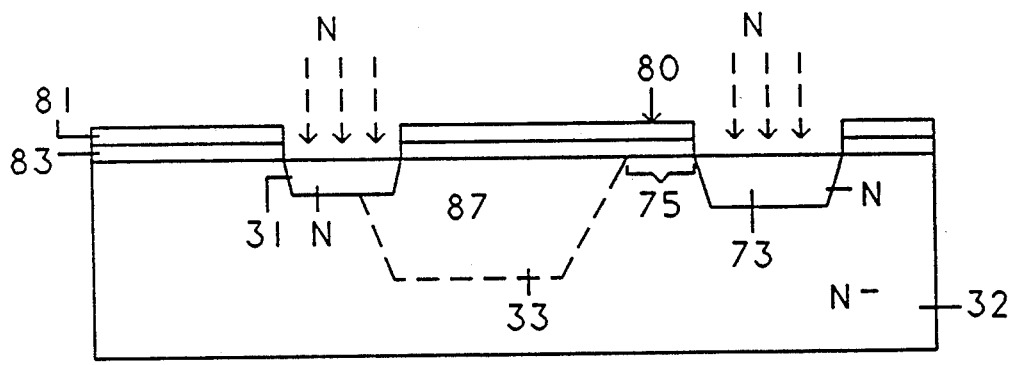
FIG. 5 shows the surface topography of a wafer after an N field implant, with an N field implant region being spaced from a drain region by a surface portion on which a local oxidation resistance layer is disposed.

As shown in FIG. 4, a field implant, local oxidation mask 80 (e.g. a patterned layer of silicon nitride 81 overlying a pad oxide layer 83) is configured to have a portion 85 overlying surface portion 75 that provides the necessary spacing around a portion 87 of the N−body 32 into which P drain region 31 is to be or has been formed. FIG. 5 shows the surface topography of the wafer after the field implant step, with N field implant region 73 being spaced from the drain region 33 by surface portion 75 on which oxidation resistance layer 80 is disposed.

Figure 6:
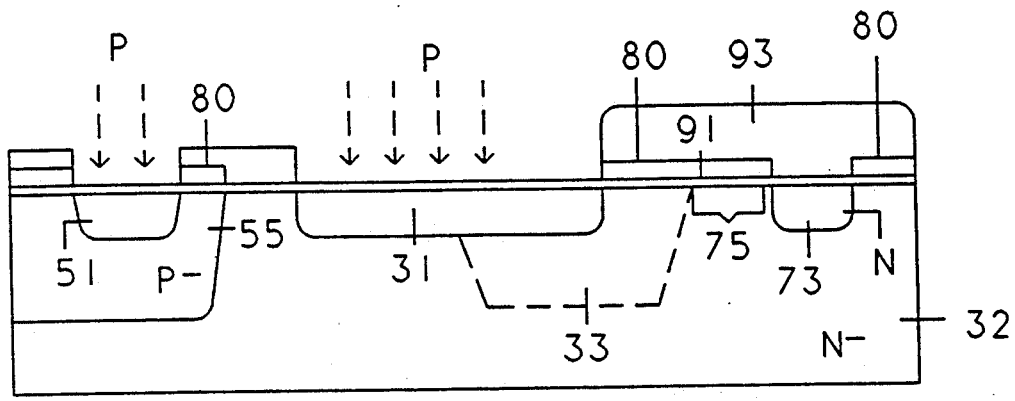
FIG. 6 shows a P field implant mask selectively formed over N field implant regions with a compensating P field implant which overdopes those portions of an N field implant which are to function as P channel stop regions of a NMOS device, and a P type drift region of a PMOS device.
Figure 7:
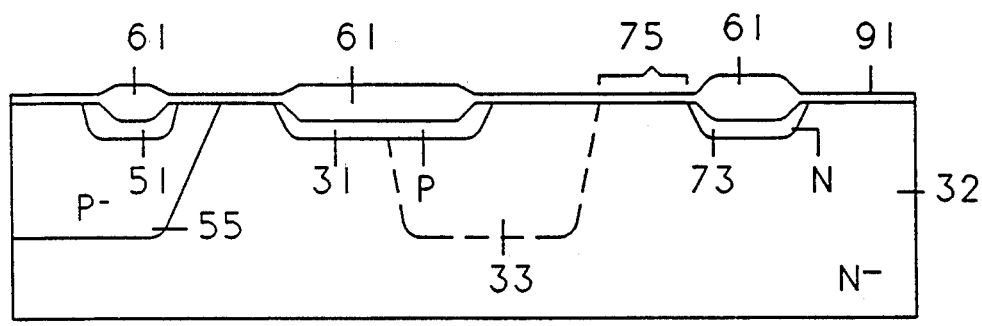
FIG. 7 shows the structure of FIG. 6 after being subjected to local oxidation of the field implants.

Before the formation of field oxide 61, a P field implant mask 93 is selectively formed over the N field implant regions, as shown in FIG. 6, and a compensating P field implant step is performed, so as to overdope those portions of the N field implant which are to function as P channel stop regions of a NMOS device, and P type drift region 31 of PMOS device 30. Next, as shown in FIG. 7, the P implant mask 93 is removed and the surface of the respective implant regions is subjected to local oxidation to form field oxide layer 61.

Figure 8:
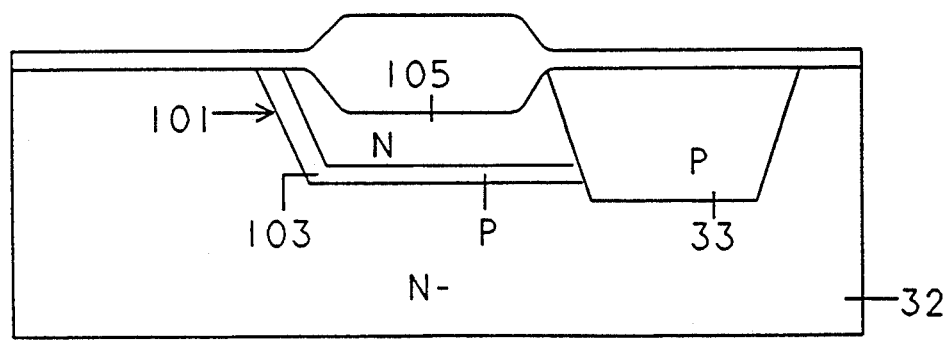
FIG. 8 shows the application of the present invention to the case of a high voltage, lateral PMOS device, where the lateral drift region is formed as a dual implant region.

FIG. 8 shows the application of the present invention to the case of a high voltage, lateral PMOS device, where the lateral drift region is formed as a dual implant region 101. As described in my above-referenced U.S. Patent, such a dual layer drift region has the advantage of providing a reduction in on-resistance. In this embodiment, the doping profile (including depth and impurity concentration) of the N field implant of the PMOS device is more shallow than that of the P field implant of the complementary NMOS device. Namely, each of the respective P portion 103 and N portion 105 of the dual implant lateral drift region 101 is formed simultaneously with the formation of an associated P and N field implant of the complementary MOS architecture. Because of the differential depths of the P and N field implants, dual layer drift region 101 has the intended on-resistance reducing profile.

In accordance with a further embodiment of the present invention, where the doping profile of the field implant of the complementary MOS device's (NMOS device in the present example) is different (heavier) than desired for the profile of the P drift region to be formed in the high voltage (PMOS) device of interest advantage may be taken of a same polarity type (N type in the case of a PMOS device) impurity introduction step, so as to provide a compensating like-polarity well region in the body of the device.

Figure 9:
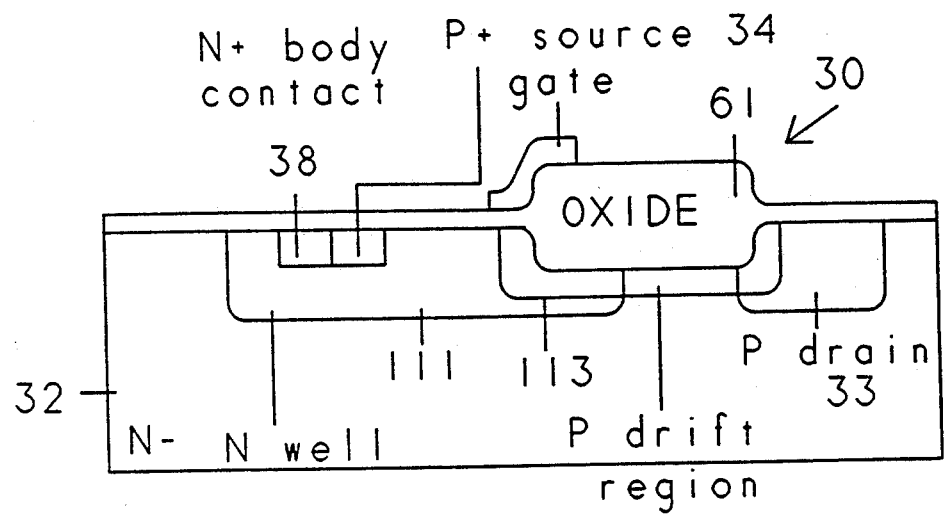
FIG. 9 diagrammatically illustrates, for the case of forming a high voltage P channel MOS device in an N− body, a the mask used to introduce an N type well region into the complementary (P well) material of the wafer may be selectively modified to simultaneously introduce an N well region in a surface portion of the N− body, where the P drift region is to be formed by means of a P field implant carried out in the complementary (NMOS) device.

Namely, as diagrammatically illustrated in FIG. 9, in the case of forming high voltage P channel MOS device 30 in N− body 32, the mask used to introduce an N type well region into the wafer may be selectively modified to simultaneously introduce an N well region 111 in a surface portion 113 of the N− body 32 where the P drift region 31 is to be formed by means of a P field implant carried out in the complementary (NMOS) device. The differential (increased) doping of the N well region 111 relative to that of N− body 32 effectively allows the P field implant that is employed to form P drift region 31 to be adjusted or tailored to within a target window of the desired depletion threshold of the drift region. Namely, the introduction of such a 'tuning' N well into the surface of the N− body provides a prescribed degree of compensation of the P field doping, so as to reduce the net doping of the drift region 31 and thereby provide a lower total depletion voltage for the drift region 31 resulting from both the lower net drift region charge and the increased doping concentration (N vs N−) in the N− body adjacent to the drift region.

Pursuant to a further embodiment of the present invention, a gate threshold implant adjustment step may be employed as a alternative to using a channel stop field implant from a complementary device in order to form the drift region of a high voltage MOS device. Namely, in some MOS processes, a reduced doping implant is employed in the gate region for the purpose of adjusting the turn-on threshold voltage of the device. Examples are a buried channel device and a depletion mode field effect transistor. The threshold implant underlies a thin surface oxide (on which a gate electrode is formed) rather than a thick field oxide. As long as the threshold adjustment implant of the adjusted device is of sufficient doping concentration to form a PN junction with the body of the high voltage MOS devices of interest, it may be also employed to form a drift region in accordance with the present invention. Thus, in accordance with this further embodiment (as applied to the example of a PMOS device), the mask employed for adjustment of the gate threshold of a depletion PMOS device within a complementary polarity architecture is configured to provide a doping window for a P-type drift implant in the PMOS device. Then, simultaneously with the P implant into the channel surface portion of the depletion PMOS device for gate threshold adjustment, the P drift region of the high voltage lateral PMOS device is also implanted.

Figure 10:
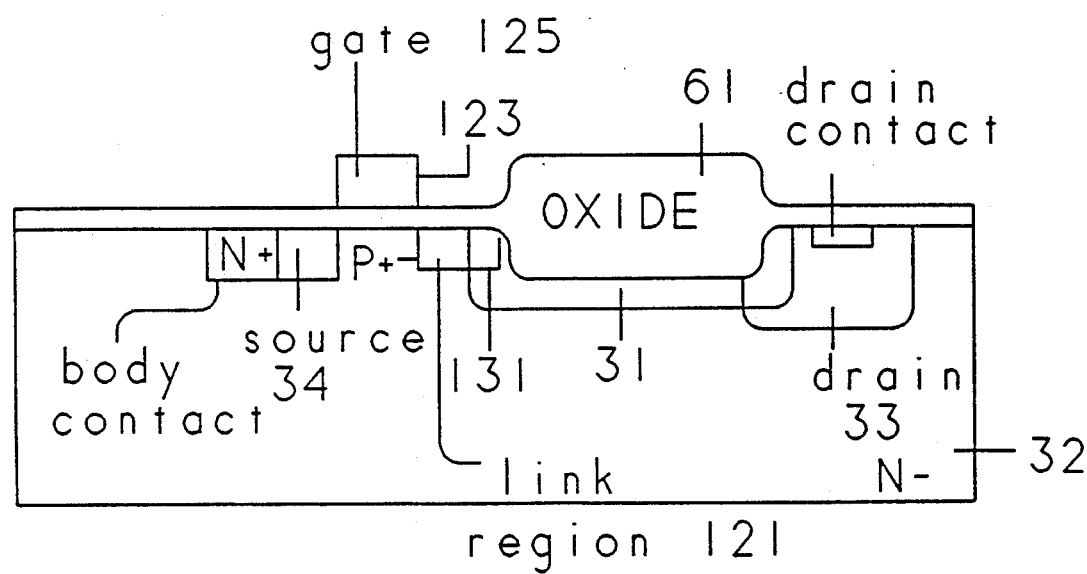
FIG. 10 diagrammatically illustrates, for the case of a PMOS device, the use of a P-type link region between a field implant drift region and a drain edge of a gate electrode 125.

As noted above, because the field implant step takes place prior to formation of the gate electrode of an MOS device, the drift region will not necessarily be aligned with the gate, which must overlap the drain-extension region for MOS operation. As a consequence, there is an alignment tolerance between the source region (which is self aligned with and defined by an edge of the gate material) and the field implant drift region with which the gate must be aligned (overlap). In accordance with a further aspect of the present invention, diagrammatically illustrated in FIG. 10 for the case of the example of a PMOS device, this alignment tolerance problem may be solved by introducing a P-type 'link' region 121 between the field implant drift region 31 and the drain 123 edge of the (polysilicon) gate electrode 125. In the case of the high voltage PMOS device of the present example, P-type link region 121 may be formed by using the P+ implant step used for the source and drain contacts. Since link region 121 is more heavily doped than the P field implant used to form the drift region 31, the reverse breakdown voltage of its PN junction 131 with N− body 32 is lower than that of the more lightly doped drain-extension region 31. Consequently, the parameters of the drift region must be tailored so that the drift region becomes totally depleted before breakdown occurs in the link region-to-body junction under a reverse bias condition. The doping conditions necessary to achieve the necessary total depletion of the drift region may be deterministically based upon the intended geometry and operational parameters of the MOS device.

Figure 11:
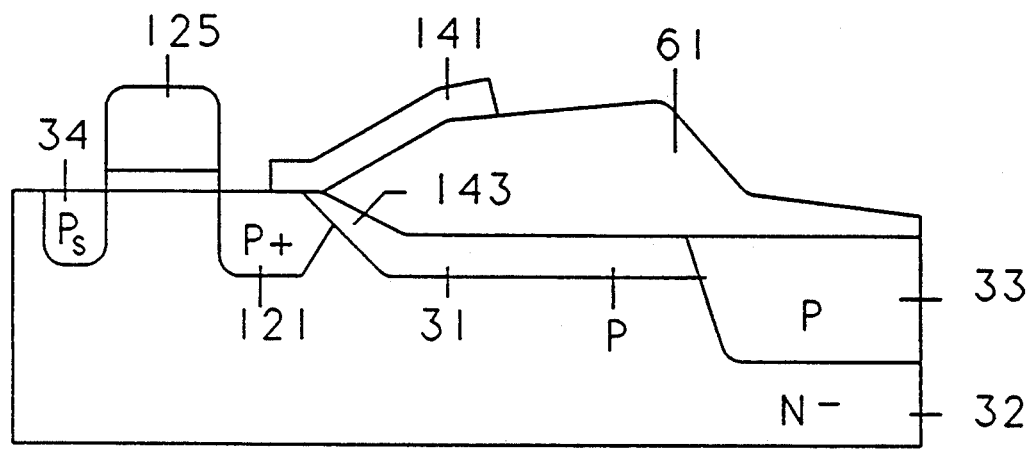
FIG. 11 diagrammatically illustrates the formation of an electrostatic shield plate layer on a portion of a field oxide layer that overlies the interface of a drift region with a link region.

In addition, because the more lightly doped drift implant region is sensitive to charge build-up on the surface of the overlying field oxide (its conductivity is subject to being 'modulated' by such charge), an electrostatic shield plate layer may be formed on a portion of the field oxide that overlies the interface of the drift region with the link region, as diagrammatically illustrated in FIG. 11. Specifically, electrostatic shield plate (aluminum) layer 141 may be defined by the mask used to selectively form the interconnect pattern atop the wafer. Electrostatic shield plate layer 141 is formed on portion of the field oxide 61 that overlies the interface 143 of drift region 31 with link region 121 and so as to ohmically contact link region 121. When so disposed, shield plate layer 141 draws off mobile charge, that might otherwise settle on the surface portion of field oxide layer 61 covered by the shield plate, so that such charge cannot modify the intended electrical parameters (alter the effective doping) of the underlying drain-extension, drift region 31.

The concurrent processing step methodology of the present invention of taking advantage of the capabilities of the processing steps that are used in a low voltage complementary device processing in order to form high voltage devices is not only applicable to the formation of and tailoring the characteristics of a lateral drift, drain-extension region of a high voltage MOS device, as described in the foregoing examples, but is also applicable to other aspects of the architecture through which a lateral high voltage MOS structure is defined.

Figure 12:
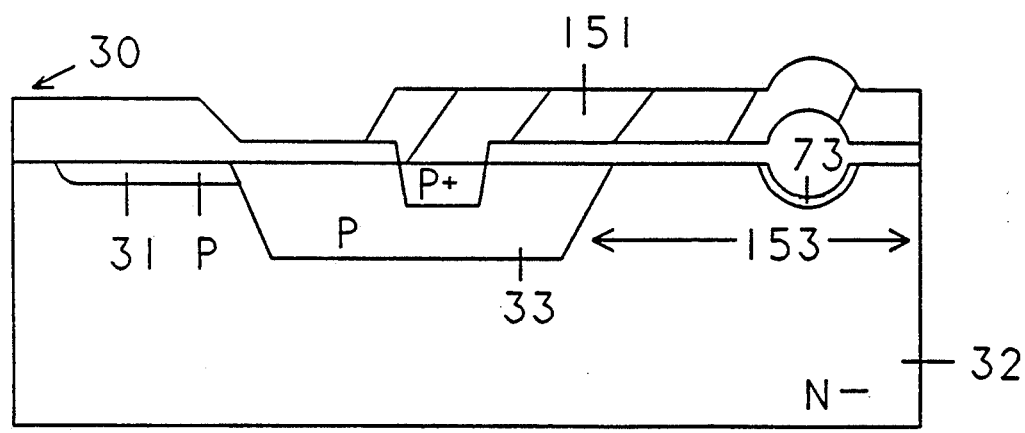
FIG. 12 diagrammatically illustrates a layer of interconnect track for a drain region of a high voltage MOS device routed to another, spatially removed area of the wafer.

For example, as diagrammatically illustrated in the simplified cross-sectional view of FIG. 12, when a layer of interconnect track 151 (typically an aluminum layer) for the drain region 33 of a high voltage MOS device 30 is routed to another, spatially removed area of the wafer, protection must be provided against the formation of an induced, parasitic channel in a surface portion 153 of the body beneath the aluminum track, since such a channel could cause an unwanted connection between the drain region 33 and another region (not shown). Because of the substantially increased magnitude voltage (e.g. on the order of several hundred volts) that may be present on aluminum interconnect layer 151 for high voltage device 30, the resulting electric field imparted to the underlying surface portion 153 of $N^-$ body will far exceed the threshold voltage necessary to overcome the N channel stop 73 formed by the field implant for an NMOS device.

Figure 13:
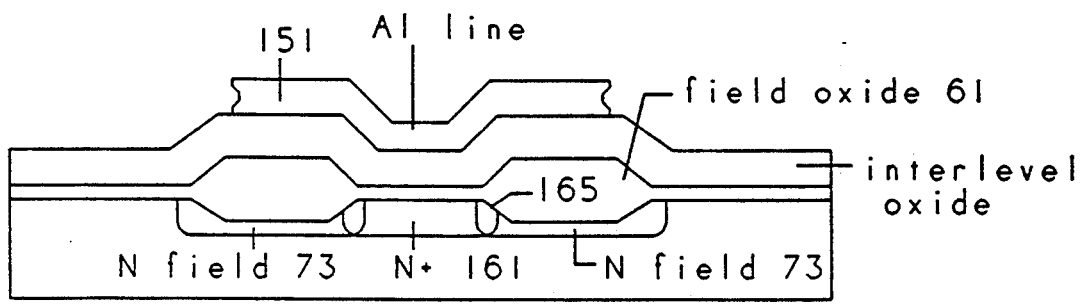
FIG. 13 shows an embodiment of the present invention in which the inducement of a surface inversion layer as a result of a high voltage being applied to an interconnect layer is prevented by increasing the impurity concentration of a portion of a field implant region.
Figure 14:
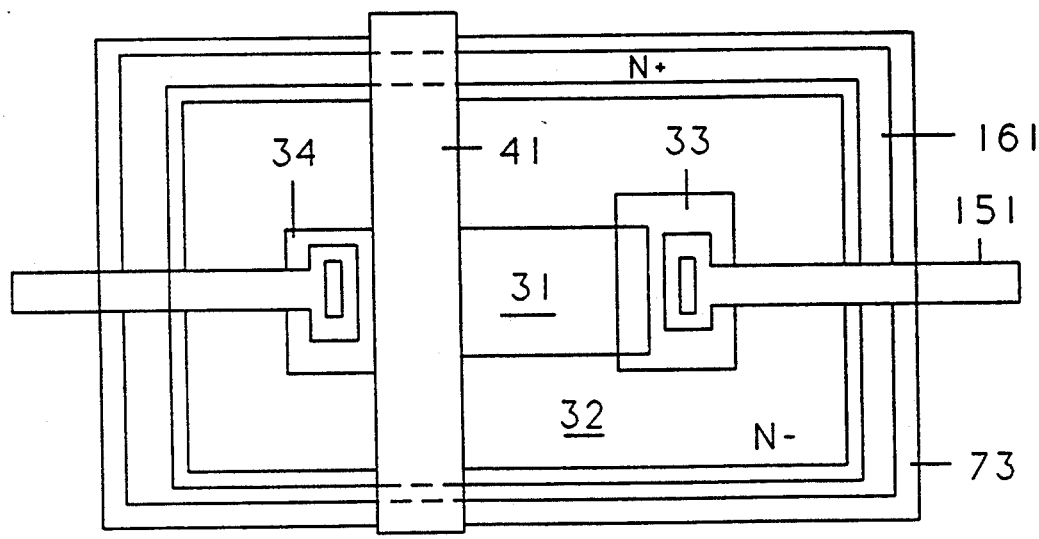
FIG. 14 shows the topography of an N+ modified N field implant completely surrounding a PMOS device, so that any surface interconnect path from its drain region to another portion of the wafer must cross over an N+ region.

In accordance with a further embodiment of the present invention, this high voltage interconnect problem is successfully remedied by increasing the impurity concentration of a portion of the field implant region, as illustrated in FIG. 13 at $N+$ portion 161 of an N field implant 73 for PMOS device 30, so as to form an effective channel stop for the high voltage PMOS device. The increased impurity concentration portion 161 of the N field implant 73 may be formed by using the same doping step used to form $N+$ body contact region 38 in a surface portion of $N^-$ body 32. As shown in FIG. 13, $N+$ region 161 may be introduced so as to be located generally in the middle of a N field implant 73, so that its edge 165 terminates in an intermediately doped portion, thereby reducing the crowding of electric field flux lines at the $N+$ to $N^-$ body high/low junction, which has the potential of inducing avalanche injection-limited breakdown. The topography of N field implant 73 may be such as to completely surround the PMOS device, as shown in FIG. 14, so that any surface interconnect path from drain region 33 to another portion of the wafer must cross over $N+$ region 161.

Figure 15:
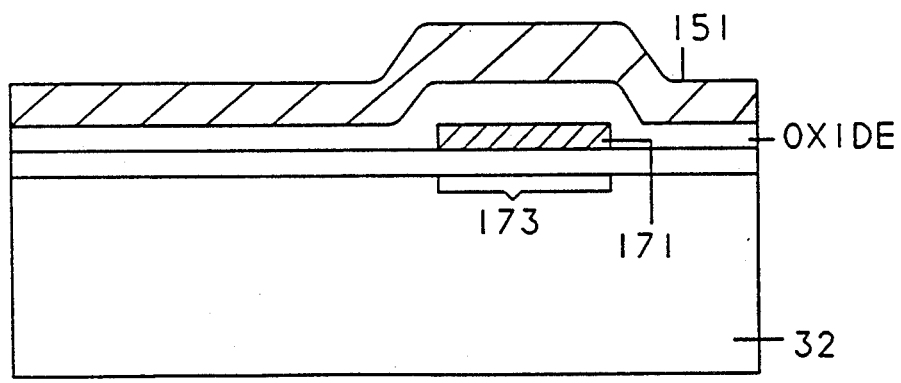
FIG. 15 diagrammatically illustrates a separate length of polysilicon material formed beneath an aluminum interconnect track, so as to effectively shield an underlying body surface from the electric field emanating from the aluminum track, when a high voltage is applied to the drain interconnect.

Pursuant to a further embodiment, diagrammatically illustrated in FIG. 15, a separate length of conductor material 171, for example that of which MOS gate electrodes are formed, may be formed beneath the aluminum interconnect track 151, so as to effectively shield its underlying body surface 173 from the electric field emanating from the aluminum track, when a high voltage is applied to the drain interconnect. Such a polysilicon layer may also be biased as necessary to provide the requisite shielding functionality, so that any inversion layer that is otherwise induced in the surface of the body beneath the drain contact aluminum layer 151 is effectively interrupted where the polysilicon layer 171 passes underneath the aluminum track.

Figure 16:
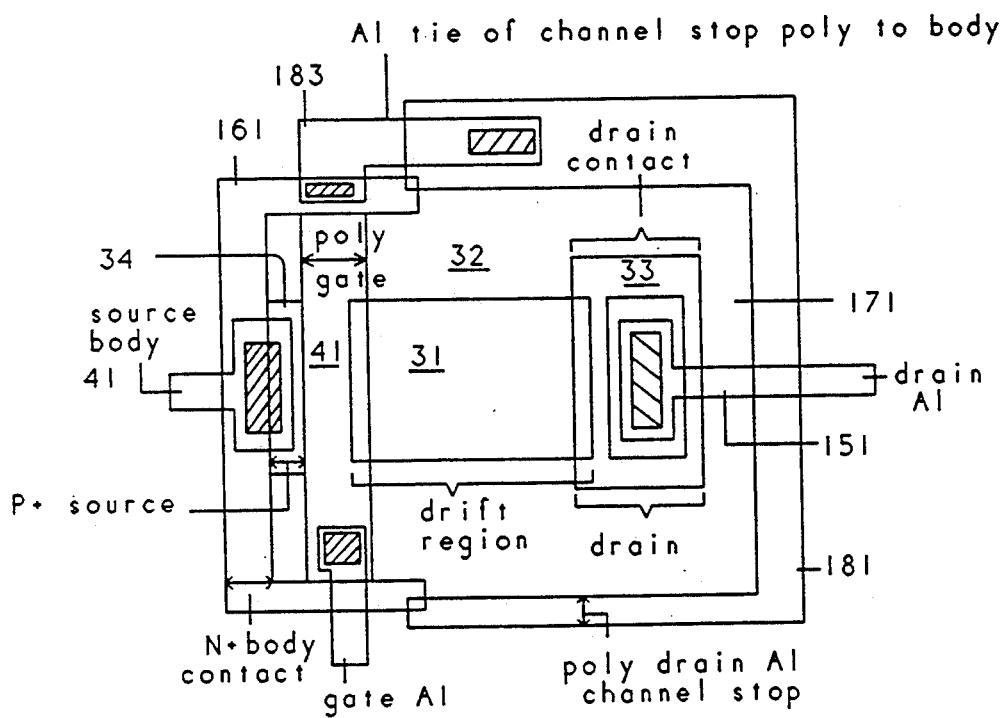
FIG. 16 illustrates a top view of a PMOS device showing how a polysilicon shield layer may be combined with a high impurity implant region, so as to form a shielding ring around a drain region, thereby providing complete protection against a high voltage induced parasitic channel that would otherwise short the high voltage drain to another region.

As further illustrated in the top view of FIG. 16, polysilicon shield layer 171 may be combined with the high impurity implant region 161, described above with reference to FIG. 14, so as to form shielding ring 181 around drain region 33, thereby providing complete protection against a high voltage induced parasitic channel that would otherwise short the high voltage drain to another region. In the topography shown in FIG. 16, polysilicon shield layer 171 is conductively joined with high impurity implant region 161 by way of a conductive (e.g. aluminum) tie 183, so that the combined shape of the shield (comprised of $N+$ implant and polysilicon) is such as to completely surround the PMOS device, so that any surface interconnect path from drain region 33 to another portion of the wafer must cross over the shield.

As noted above, depending upon available process capability, other high voltage doping enhancements for the field implant may be used to obtain the combined high voltage, low voltage architecture of the present invention. For example, if the low voltage CMOS process provides for a more graded $N+$ implant, such as a deep $N+$ region, the field implant may be modified to incorporate such a graded profile in the vicinity of (but spaced apart from) the drain region. It should also be noted that the lateral MOS device can be formed in any surface-doped region in which junctions of desired breakdown can be formed, and on which desired device threshold voltage can be attained. Examples for a PMOS structure include the N-type substrate of a P well process, N-type islands isolated by dielectric isolation or by junction isolation, and an N well formed in a P type body.

As will be appreciated from the foregoing description, the need for additional processing steps that are dedicated exclusively to the formation of high voltage device regions, such as drain extension, drift region, is effectively obviated in accordance with the present invention, by taking advantage of capabilities of existing processing steps that are used to form low voltage CMOS devices. In particular, the present invention involves selectively employing region forming steps or interconnect-forming steps through which low voltage CMOS devices are realized, so as to simultaneously form one or more regions or layers at selected sites of a substrate where high voltage devices are to be formed. Such selective modification of an already existing mask set designed for low voltage CMOS typography allows additional doping of the substrate or provision of further overlay material to accommodate the effects of high voltage operation of selected areas of the wafer and thereby effectively performs precursor tailoring or modification of those portions of the wafer where a high voltage condition will be encountered.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A process for manufacturing a field effect transistor comprising the steps of forming source and drain regions in a semiconductor substrate, forming a gate overlying a surface of said substrate between said source and drain regions, forming a lateral drift, drain extension region, which extends in said substrate from said drain region to a surface portion of said substrate proximate said gate, and forming an increased impurity concentration field region of a conductivity type opposite to that of said drain region as a channel stop region beneath a field insulator layer overlying said substrate, said channel stop region being spaced apart from said drain regions by semiconductor material of said substrate therebetween, and wherein the step of forming said increased impurity concentration field region is also employed to simultaneously form at least a portion of said lateral drift, drain extension.

2. A process for manufacturing a field effect transistor comprising the steps of forming source and drain regions of a first conductivity type in a first semiconductor body portion of a second conductivity type, opposite said first conductivity type, forming a gate overlying a surface of said first body portion between said source and drain regions, forming an increased impurity concentration field region of said first conductivity type beneath a field insulator layer overlying a second semiconductor body portion of said first conductivity type, and making use of a first conductivity type impurity implant step that is used to form an increased impurity concentration, channel stop region in a surface portion of said second body portion in which a complementary MOS device is formed in order to simultaneously form at least a portion of a lateral drift, drain extension region of said first conductivity type contiguous with said drain region of said first conductivity type, and wherein said first conductivity type impurity implant step is carried out so as to space said increased impurity concentration, channel stop region of said first conductivity type in said second body portion spaced away from a drain region of said second conductivity type of an MOS device in said second body portion, and thereby avoid a reduction in the drain-to-second body portion junction breakdown.

3. A process according to claim 2, wherein said lateral drift region is formed as a dual implant region, and wherein said first conductivity type impurity implant step employed to form said lateral drift, drain extension region of said first conductivity type contiguous with said drain region of said first conductivity type is carried out as a relatively deep implant underlying a more shallow implanted region of said second conductivity type.

4. A process according to claim 3, wherein each of said relatively shallow implant of said second conductivity type and said more deeply implanted region of said first conductivity type that define said lateral drift region are carried out simultaneously with the formation of respective first and second field implants of a complementary MOS architecture.

5. A process according to claim 2, further including the step of providing a well region of said second conductivity type in said first body portion, said well region having an impurity concentration greater than that of said first body portion.

6. A process according to claim 2, further including the step of introducing a link region of said first conductivity type so as to be contiguous with said field implant drift region and a drain side edge of said gate.

7. A process according to claim 6, wherein said link region is formed by a high impurity concentration implant step used for source and drain contact regions, whereby said link region is more readily doped than said field implant.

8. A process according to claim 6, further including the step of forming an electrostatic shield plate layer on a portion of a field insulator layer that overlies the interface of said lateral drift region with said link region.

9. A process according to claim 8, wherein said shield plate layer is formed so as to be connected to said link region.

10. A process for manufacturing a field effect transistor comprising the steps of forming source and drain regions of a first conductivity type in a first semiconductor body portion of a second conductivity type, opposite said first conductivity type, forming a gate overlying a surface of said first boy portion between said source and drain regions, forming an increased impurity concentration field region of said first conductivity type beneath a field insulator layer overlying a second semiconductor body portion of said first conductivity type, and making use of a first conductivity type impurity implant step that is used to form an increased impurity concentration, channel stop region in a surface portion of said second body portion in which a complementary MOS device is formed in order to simultaneously form at least a portion of a lateral drift, drain extension region of said first conductivity type contiguous with said drain region of said first conductivity type, and wherein a second conductivity type impurity implant step is carried out so as to space a corresponding field threshold augmentation region of said second conductivity type in said first body portion spaced away from said drain region of said first conductivity type of an MOS device in said first body portion, and thereby avoid a reduction in the drain-to-first body portion junction breakdown.

11. A process according to claim 10, wherein said first conductivity type impurity implant step is carried out so as to space said increased impurity concentration, channel stop region of said first conductivity type in said second body portion spaced away from a drain region of said second conductivity type of an MOS device in said second body portion, and thereby avoid a reduction in the drain-to-second body portion junction breakdown.

12. A process according to claim 11, wherein said first and second conductivity type field implants are formed by using a blanket implant of one conductivity type dopant initially performed everywhere a field implant is desired, followed by a second, compensating implant to delineate respective field thresholds and associated drift regions of complementary MOS devices, and wherein drain-to-field implant spacing is obtained by using a local oxidation mask to preliminarily define the topography surrounding drain regions of said complementary MOS devices.

13. A process according to claim 12, wherein said local oxidation mask is configured to provide a surface barrier around that portion of a body portion into which drain doping is to be performed, said surface barrier separating a surface portion of a body portion between a drain region and an adjacent field implant.

* * * * *